United States Patent
Fujimori

(10) Patent No.: US 7,366,648 B2
(45) Date of Patent: Apr. 29, 2008

(54) ELECTRONIC CIRCUIT ANALYZING APPARATUS, ELECTRONIC CIRCUIT ANALYZING METHOD, AND ELECTRONIC CIRCUIT ANALYZING PROGRAM

(75) Inventor: Shogo Fujimori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 483 days.

(21) Appl. No.: 10/992,731

(22) Filed: Nov. 22, 2004

(65) Prior Publication Data

US 2006/0036423 A1 Feb. 16, 2006

(30) Foreign Application Priority Data

Aug. 11, 2004 (JP) ............................. 2004-234161

(51) Int. Cl.
*G06F 17/50* (2006.01)

(52) U.S. Cl. .............................. 703/14; 703/2; 703/15; 703/19; 324/426; 707/2; 716/4; 716/1; 716/20; 716/18

(58) Field of Classification Search ................... 703/14, 703/15, 2, 19; 716/4, 18, 6, 20, 1; 702/189, 702/125, 81; 73/736
See application file for complete search history.

(56) References Cited

U.S. PATENT DOCUMENTS 5,446,676 A * 8/1995 Huang et al. .................. 703/19
5,822,218 A * 10/1998 Moosa et al. ................... 716/4

(Continued)

FOREIGN PATENT DOCUMENTS

JP         10-021267        1/1998

(Continued)

OTHER PUBLICATIONS

Fernandez et al., "A mathematical model for defect impact based on in-line vs test data corrections", IEEE 1999.*

(Continued)

*Primary Examiner*—Paul Rodriguez
*Assistant Examiner*—Kandasamy Thangavelu
(74) *Attorney, Agent, or Firm*—Staas & Halsey LLP

(57) ABSTRACT

The present invention provides an electronic circuit analyzing apparatus for evaluating the reliability value of an analysis result, an electronic circuit analyzing method, and an electronic circuit analyzing program. The electronic circuit analyzing apparatus comprises an input information storage unit 1 that stores input information, an analytic model creation unit 12 that creates an analytic model of an electronic circuit on the basis of the input information, an analysis unit 3 that calculates an analysis result of the electronic circuit using the analytic model, a partial model reliability value database 21 that defines the accuracy of each part of the analytic model and stores the accuracy value as a partial model reliability value, a partial model influence database 22 that defines the magnitude of influence of each part of the analytic model and stores the influence value as a partial model influence, a reliability value evaluation unit 23 that calculates an analysis result reliability value, i.e. the reliability value of the analysis result, on the basis of the partial model reliability value and partial model influence, an analysis result determination unit 14 that determines whether the analysis result is good or bad, and a display unit 15 that displays the analysis result reliability value and the result of the good/bad determination.

26 Claims, 6 Drawing Sheets

U.S. PATENT DOCUMENTS

| | | | |
|---|---|---|---|
| 6,024,478 A | 2/2000 | Yamamoto | 716/5 |
| 6,388,450 B2* | 5/2002 | Richter et al. | 324/427 |
| 6,470,479 B1 | 10/2002 | Yamamoto | 716/4 |
| 6,578,181 B2 | 6/2003 | Hisada et al. | 716/5 |
| 6,637,018 B1* | 10/2003 | Demler | 716/18 |
| 7,065,720 B2* | 6/2006 | Croix | 716/1 |
| 7,089,143 B2* | 8/2006 | Foreman et al. | 702/125 |
| 7,191,113 B2* | 3/2007 | Acar et al. | 703/15 |
| 7,194,366 B2* | 3/2007 | Singh et al. | 702/81 |
| 7,194,716 B2* | 3/2007 | Croix | 716/6 |
| 2001/0009370 A1* | 7/2001 | Richter et al. | 324/426 |
| 2001/0034587 A1* | 10/2001 | Anderson et al. | 703/2 |
| 2002/0095273 A1* | 7/2002 | Tanizawa | 702/189 |
| 2002/0111700 A1* | 8/2002 | Arena et al. | 700/50 |
| 2004/0069069 A1* | 4/2004 | Gysling et al. | 73/736 |
| 2004/0073412 A1* | 4/2004 | Walker et al. | 703/2 |
| 2004/0073537 A1* | 4/2004 | Thiesson et al. | 707/2 |
| 2004/0139419 A1* | 7/2004 | Jiang et al. | 716/20 |

FOREIGN PATENT DOCUMENTS

| | | |
|---|---|---|
| JP | 2002-149740 | 5/2002 |

OTHER PUBLICATIONS

Guinee et al., "A novel modulated single Fourier series time function for mathematical modeling . . . in high performance brushless motor drives", IEEE 2003.*

Heydariet et al., "Jitter-induced Power/ground noise in CMOS PLLs: A design perspective", IEEE 2001.*

Heydari al., "Analysis of Jitter due to power supply noise in Phase locked loops", IEEE 2000.*

Willing et al., "Establishing ASIC fault-coverage guidelines for high-reliability systems", IEEE 1998.*

First Office Action of the corresponding German patent application.

* cited by examiner

FIG. 2

| ITEM | | RELIABILITY VALUE ACCORDING TO FREQUENCY | | |
|---|---|---|---|---|
| LARGE ITEM | SMALL ITEM | ≦100MHz | ≦300MHz | ≦1GHz |
| ELEMENT MODEL DESCRIPTION FORMAT | TRANSISTOR MODEL | 100 | 100 | 100 |
| | BEHAVIOR MODEL | 90 | 80 | 50 |
| | SIMPLIFIED MODEL | 80 | 50 | 20 |
| VIA MODEL | RLC MODELING FROM 3D FORM | 100 | 100 | 100 |
| | RLC MODELING FROM NUMBER OF PENETRATED LAYERS | 90 | 80 | 50 |
| | MODELING WITH ONLY CAPACITANCE VALUE | 80 | 60 | 30 |
| | NO MODELING | 60 | 40 | 20 |
| LAYOUT MODEL | MODELING IN CONSIDERATION OF DIELECTRIC ABSORPTION | 100 | 100 | 100 |
| | MODELING IN CONSIDERATION OF SKIN EFFECT | 100 | 100 | 80 |
| | RLC MODELING FROM PATTERN CROSS-SECTIONAL FORM | 100 | 80 | 50 |
| | RLC MODELING FROM Z0, Td | 80 | 50 | 30 |

FIG. 3

| ITEM | INFLUENCE VALUE ACCORDING TO FREQUENCY | | |
|---|---|---|---|
| | ≦100MHz | ≦300MHz | ≦1GHz |
| ELEMENT MODEL DESCRIPTION FORMAT | 100 | 100 | 100 |
| VIA MODEL | 20 | 50 | 80 |
| LAYOUT MODEL | 60 | 70 | 80 |

ELECTRONIC CIRCUIT ANALYZING APPARATUS, ELECTRONIC CIRCUIT ANALYZING METHOD, AND ELECTRONIC CIRCUIT ANALYZING PROGRAM

BACKGROUND OF THE INVENTION

1. Field of the Invention

The present invention relates to an electronic circuit analyzing apparatus used to check the operations of an electronic circuit, an electronic circuit analyzing method, and an electronic circuit analyzing program.

2. Description of the Related Art

As electronic circuits such as LSI (Large Scale Integration) systems, PCBs (Printed Circuit Boards), and multichip modules, for example, have increased in speed in recent years, analytic models used for signal waveform analysis have come to exhibit considerable variation depending on the frequency. As a result, determining the kind of input information to be used to create an analytic model has become important.

Moreover, since noise margins have decreased in conjunction with the development of low-power electronic circuits, it has become necessary to design electronic circuits in consideration of signal waveform variation caused by manufacturing irregularities in the element and electrical board, voltage fluctuation of the power source or ground, and so on.

The constitution of a conventional electronic circuit analyzing apparatus will now be described. FIG. 9 is a block diagram showing an example of the constitution of a conventional electronic circuit analyzing apparatus. This electronic circuit analyzing apparatus is constituted by an input information storage unit 1, an analytic model creation unit 2, an analysis unit 3, an analysis result determination unit 4, and a display unit 5.

The input information storage unit 1 stores analysis conditions, layout data, element model data, and parameter data, which are used in an electronic circuit simulation, as input information. Here, the analysis conditions include the analysis frequency, the analysis time, and so on. The layout data are data used when designing the electrical board layout. The element model data describe the electrical characteristics of the element in a predetermined format. The parameter data are analysis parameters relating to the material, form, and so on of the electrical board.

The analytic model creation unit 2 creates an analytic model to be used in a simulation from the input information stored in the input information storage unit 1, and outputs the analytic model to the analysis unit 3. The analysis unit 3 performs a simulation using the analytic model, and outputs waveforms calculated at arbitrary measurement location positions on the electronic circuit to the analysis result determination unit 4 and display unit 5 as the analysis result. The waveforms express temporal transition in the voltage value, for example. The analysis result determination unit 4 determines whether the analysis result is good or bad using a predetermined condition, and outputs "good" or "bad" to the display unit as the determination result. The predetermined condition is a input voltage range value on an element data sheet or the like, for example. If there is more than one analysis result, the analysis result determination unit 4 performs a plurality of good/bad determinations.

When, for example, the analysis result is a voltage waveform, and the determination threshold is a maximum input voltage range value, the determination result is good if the peak value of the voltage waveform is equal to or less than the maximum input voltage range value, and bad if the peak value of the voltage waveform exceeds the maximum input voltage range value. When the determination threshold is VIH (minimum High-level input voltage), the determination result is good if the voltage waveform in the analysis result exceeds VIH when High is expected, and bad if the voltage waveform is equal to or less than VIH.

The display unit 5 displays the analysis result and whether the determination result is good or bad.

Note that, as a reference of the related art, Japanese Patent Laid-Open No. H10-21267 (pages 6-15, FIG. 1) is known.

However, in the conventional electronic circuit analyzing apparatus, only the analysis result and the good/bad determination result thereof are notified, and decisions regarding the type of input information to be used to create the analytic model, and whether to perform analysis taking into account signal waveform variation caused by manufacturing irregularities in the element and electrical board, voltage fluctuation in the power source and ground, and so on are left to the user of the electronic circuit analyzing apparatus.

Moreover, since the accuracy and reliability of the analysis result are heavily dependent on the input information, it may be impossible to obtain a correct analysis result due to insufficient input information, low input information accuracy, and so on.

Further, since the type and accuracy of the input information required when performing analysis vary according to the operating conditions of the electronic circuit (operational frequency, output characteristic of the element, I/O buffer, internal resistance of the element, and so on), specialist capabilities are required to perform analysis with a high degree of reliability value. Hence the reliability value of the analysis result depends greatly on the capability of the designer, leading to irregularities in the design quality of products designed on the basis of the analysis result.

Furthermore, it is time-consuming to gather and measure accurate input information, and hence to shorten the design period, input information must be suppressed to a minimum while maintaining the reliability value of the analysis result.

SUMMARY OF THE INVENTION

The present invention has been designed in order to solve the problems described above, and it is an object thereof to provide an electronic circuit analyzing apparatus which evaluates the reliability value of an analysis result, an electronic circuit analyzing method, and an electronic circuit analyzing program.

To solve the problems described above, the present invention provides an electronic circuit analyzing apparatus for performing analysis of an electronic circuit on the basis of input information describing the electronic circuit, comprising: an analytic model creation unit that creates an analytic model of the electronic circuit on the basis of the input information; an analysis unit that calculates an analysis result of the electronic circuit using the analytic model; and a reliability value evaluation unit that calculates an analysis result reliability value, which is the reliability value of the analysis result, on the basis of a partial model reliability value that defines the reliability value of the analysis result for each of a plurality of modeling methods used in each part of the analytic model.

In this electronic circuit analyzing apparatus, the partial model reliability value is further defined for each of a frequency range.

Further, the reliability value evaluation unit calculates the analysis result reliability value on the basis of all of the partial model reliability values in the analytic model.

The present invention is also an electronic circuit analyzing apparatus for performing analysis of an electronic circuit on the basis of input information describing the electronic circuit, comprising: an analytic model creation unit that creates an analytic model of the electronic circuit on the basis of the input information; an analysis unit that calculates an analysis result of the electronic circuit using the analytic model; and a reliability value evaluation unit that calculates an analysis result reliability value, which is the reliability value of the analysis result, on the basis of a partial model reliability value that defines the accuracy of the analysis result for each of a plurality of modeling methods used in each part of the analytic model, and a partial model influence that defines the magnitude of influence on the analysis result for each of the plurality of modeling methods used in each part of the analytic model.

Here, the partial model reliability value may be further defined for each of a frequency range, and the partial model influence may be further defined for each of a frequency range.

Further, the reliability value evaluation unit may calculate the analysis result reliability value by multiplying the partial model reliability value and partial model influence for each part of the analytic model, adding the results of this multiplication for all of the parts of the analytic model together, and dividing the result of this addition by the sum total of the partial model influence value.

The reliability value evaluation unit may further output a low reliability value part, which is a part in which the partial model reliability value falls below a predetermined lower limit.

The electronic circuit analyzing apparatus may further comprise an analysis result determination unit that determines whether the analysis result is good or bad.

The present invention is also an electronic circuit analyzing method for performing analysis of an electronic circuit on the basis of input information describing the electronic circuit, comprising: an analytic model creation step which creates an analytic model of the electronic circuit on the basis of the input information; an analysis step which calculates an analysis result of the electronic circuit using the analytic model; and a reliability value evaluation step which calculates an analysis result reliability value, which is the reliability value of the analysis result, on the basis of a partial model reliability value that defines the reliability value of the analysis result for each of a plurality of modeling methods used in each part of the analytic model.

In this electronic circuit analyzing method, the partial model reliability value is further defined for each of a frequency range.

Further, the analysis result reliability value may be calculated in the reliability value evaluation step on the basis of all of the partial model reliability values in the analytic model.

The present invention is also an electronic circuit analyzing method for performing analysis of an electronic circuit on the basis of input information describing the electronic circuit, comprising: an analytic model creation step which creates an analytic model of the electronic circuit on the basis of the input information; an analysis step which calculates an analysis result of the electronic circuit using the analytic model; and a reliability value evaluation step which calculates an analysis result reliability value, which is the reliability value of the analysis result, on the basis of a partial model reliability value that defines the accuracy of the analysis result for each of a plurality of modeling methods used in each part of the analytic model, and a partial model influence value that defines the magnitude of influence value on the analysis result for each of the plurality of modeling methods used in each part of the analytic model.

The present invention is also an electronic circuit analyzing program for causing a computer to execute analysis of an electronic circuit on the basis of input information describing the electronic circuit, comprising: an analytic model creation step which creates an analytic model of the electronic circuit on the basis of the input information; an analysis step which calculates an analysis result of the electronic circuit using the analytic model; and a reliability value evaluation step which calculates an analysis result reliability value, which is the reliability value of the analysis result, on the basis of a partial model reliability value that defines the reliability value of the analysis result for each of a plurality of modeling methods used in each part of the analytic model.

The present invention is also an electronic circuit analyzing program for causing a computer to execute analysis of an electronic circuit on the basis of input information describing the electronic circuit, comprising: an analytic model creation step which creates an analytic model of the electronic circuit on the basis of the input information; an analysis step which calculates an analysis result of the electronic circuit using the analytic model; and a reliability value evaluation step which calculates an analysis result reliability value, which is the reliability value of the analysis result, on the basis of a partial model reliability value that defines the accuracy of the analysis result for each of a plurality of modeling methods used in each part of the analytic model, and a partial model influence value that defines the magnitude of influence value on the analysis result for each of the plurality of modeling methods used in each part of the analytic model.

Note that the electronic circuit analyzing program of the present invention may be recorded onto a computer-readable recording medium. Here, the term "computer-readable recording medium" includes a CD-ROM or flexible disk, a DVD disk, a magneto-optical disk, a portable storage medium such as an IC card, a database holding a computer program, or another computer and its database.

Since analysis is more time-consuming than analytic model creation, according to the present invention the reliability value of the analysis result is evaluated in advance to create an analytic model having a high degree of analysis result reliability value. Thus time required to re-execute analysis and so on can be saved, and hence the development period of the electronic circuit can be shortened. Moreover, the analysis result reliability value can be determined in accordance with the operating condition of the electronic circuit. By also displaying parts having low reliability value and a method for improving the reliability value of these parts, an analytic model having a high degree of analysis result reliability value can be created even more quickly. Even in cases where the analysis result reliability value cannot be raised, a determination as to whether the analysis result is good or bad can be performed with a high degree of accuracy by taking into account a margin which compensates for the low analysis result reliability value.

BRIEF DESCRIPTION OF THE DRAWINGS

FIG. 2 is a table showing an example of a partial model reliability value database according to this embodiment;

FIG. 3 is a table showing an example of a partial model influence value database according to this embodiment;

DESCRIPTION OF THE PREFERRED EMBODIMENTS

An embodiment of the present invention will be described below with reference to the drawings.

Figure 1:
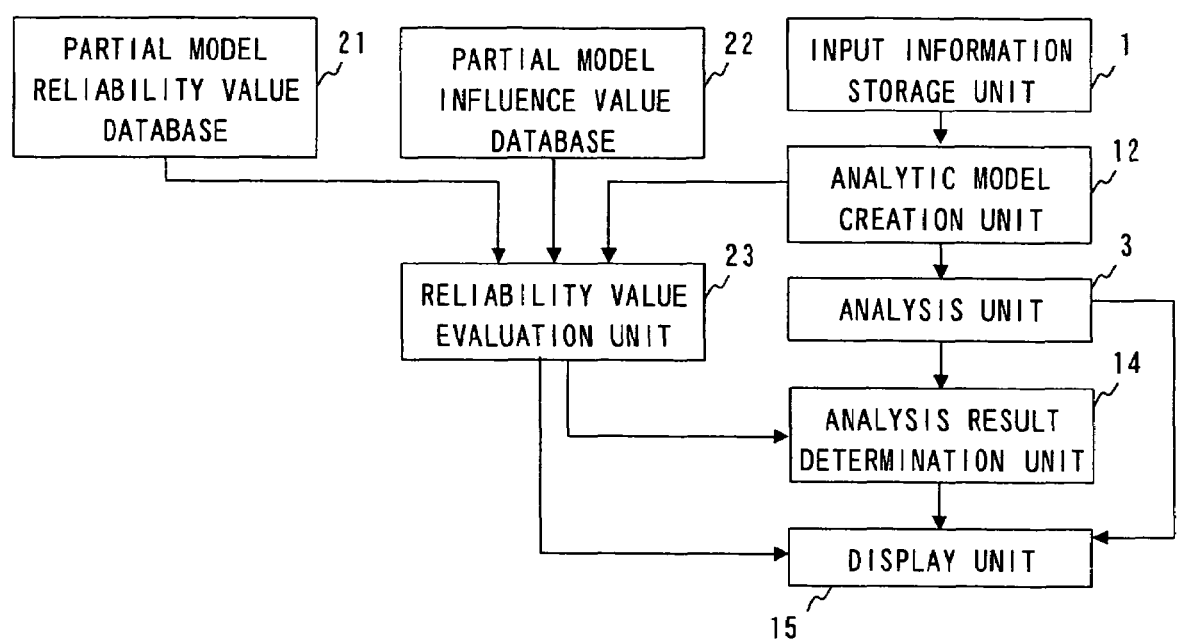
FIG. 1 is a block diagram showing an example of the constitution of an electronic circuit analyzing apparatus according to an embodiment of the present invention.
Figure 9:
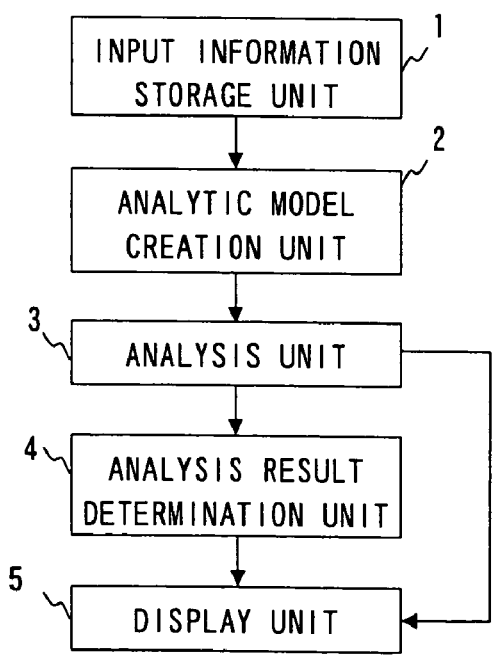
FIG. 9 is a block diagram showing an example of the constitution of a conventional electronic circuit analyzing apparatus.

First, the constitution of an electronic circuit analyzing apparatus according to this embodiment will be described. FIG. 1 is a block diagram showing an example of the constitution of the electronic circuit analyzing apparatus according to this embodiment. In FIG. 1, identical reference numerals to those of FIG. 9 denote identical or equivalent objects to those shown in FIG. 9, and hence description thereof has been omitted here. In addition to the constitution shown in FIG. 9, the electronic circuit analyzing apparatus in FIG. 1 comprises a partial model reliability value database 21, a partial model influence value database 22, and a reliability value evaluation unit 23. The electronic circuit analyzing apparatus in FIG. 1 also comprises an analytic model creation unit 12 replacing the analytic model creation unit 2 in FIG. 9, an analysis result determination unit 14 replacing the analysis result determination unit 4 in FIG. 9, and a display unit 15 replacing the display unit 5 in FIG. 9.

The analytic model creation unit 12 creates an analytic model to be used in a simulation from the input information stored in the input information storage unit 1, outputs the analytic model to the analysis unit 3, and also outputs analytic model information, which is the input information used to create the analytic model, to the reliability value evaluation unit 23. Here, the analytic model is constituted by parts such as an element model, a via model, a layout model, and so on. These parts will be referred to as partial models hereafter.

The partial model reliability value database 21 defines a reliability value for each partial model type and each modeling method thereof, and stores the reliability value as a partial model reliability value. FIG. 2 is a table showing an example of the partial model reliability value database according to this embodiment. The items in FIG. 2 are divided into a large item and a small item. The large item indicates the partial model type. This includes element model, via model, and layout model, for example. The small item indicates the modeling method for each of the partial model types in the large item section.

Examples of modeling methods for the element model include a method of describing the element as a transistor model, a method of describing the element as a behavior model, and a method of describing the element simply as a line graph from the internal resistance and the rise time of the element. Various modeling methods for the via model exist, including not modeling the via, expressing the via with a capacitance value only, expressing the via with a combination of an inductance value, a capacitance value, and a resistance value, calculating these values only from the number of layers penetrated by the via, calculating these values by further taking into account the three-dimensional form of the via, and so on, for example. The partial model reliability value is defined in relation to the frequency as well as the modeling method. The partial model reliability value is expressed as a numerical value between 0 and 100.

The partial model influence value database 22 defines the influence value of each partial model type on the analysis result, and stores this as a partial model influence value. FIG. 3 is a table showing an example of the partial model influence value database according to this embodiment. In FIG. 3, the item shows the partial model type. The partial model type includes element model, via model, and layout model, for example. The partial model influence value is defined in relation to the modeling method and the frequency. The partial model influence value is expressed by a numerical value between 0 and 100.

The modeling method of the analytic model affects the accuracy of the analysis result. Moreover, analytic model creation and analysis tend to take more time as the precision of the modeling method increases. Further, the partial model reliability value and partial model influence value need not only be values which change according to the frequency, as described above, but may also change according to the input/output characteristics of the element (rise time and fall time), the transmission method (differential signal or single-ended signal), and so on.

The reliability value evaluation unit 23 calculates the reliability value of the overall analysis result using the analytic model information, the partial model reliability value, and the partial model influence value, and outputs the reliability value to the analysis result determination unit 14 as an analysis result reliability value. When a low reliability value part having a partial model reliability value that reduces the analysis result reliability value below a predetermined lower limit exists, this part is output to the display unit 15 together with a reliability value improvement method, which is a method for improving the analysis result reliability value. Further, when a part of the analysis result reliability value is low, a margin value is output to the analysis result determination unit 14 to compensate for the analysis result reliability value.

The analysis result determination unit 14 takes the margin value into account when determining whether the analysis result is good or bad, and outputs the determination result to the display unit 15. The display unit 15 displays the analysis result reliability value, the reliability value improvement method, the analysis result, and the determination result.

Figure 4:
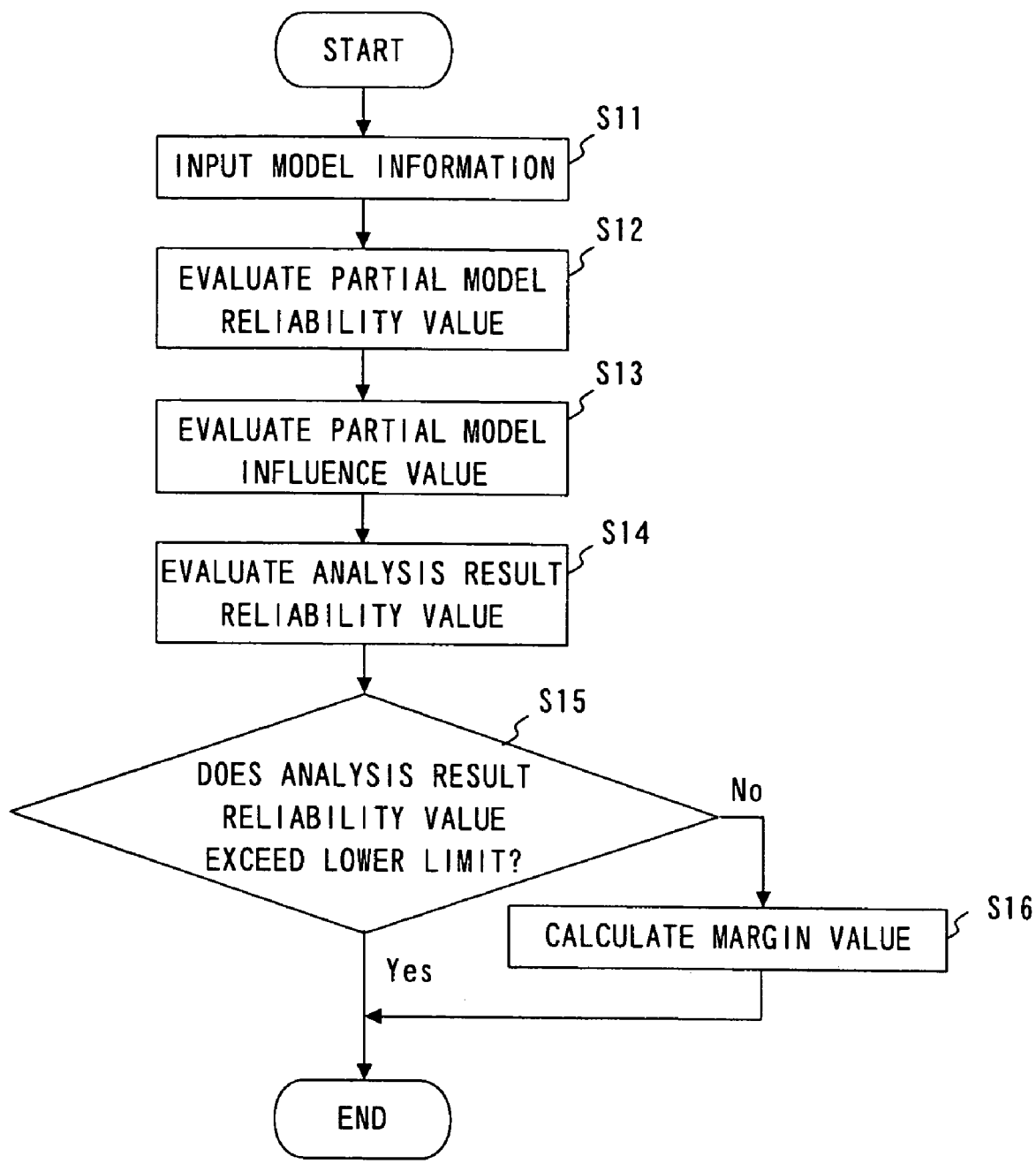
FIG. 4 is a flowchart showing an example of an operation of a reliability value evaluation unit according to this embodiment.

Next, an outline of an operation of the reliability value evaluation unit 23 will be described. FIG. 4 is a flowchart showing an example of an operation of the reliability value evaluation unit according to this embodiment. First, model information is input from the analytic model creation unit to the reliability value evaluation unit (S11). Next, the reliability value evaluation unit 23 evaluates the partial model reliability value using the model information and partial model reliability value database 21 (S12). Evaluation of the partial model reliability value will be described in detail hereafter. Next, the reliability value evaluation unit 23 evaluates the partial model influence value using the model information and the partial model influence value database 22 (S13). Evaluation of the partial model influence value will be described in detail hereafter. Next, the reliability value evaluation unit 23 evaluates the analysis result reliability value using the partial model reliability value and partial model influence value, and outputs this to the analysis result determination unit (S14).

Here, the analysis result reliability value is calculated by multiplying the partial model reliability value and partial model influence value for each partial model, adding together the multiplication results for all of the partial models, and dividing the resulting value by the result of adding together all of the partial model influence value values. An example will be described in which the analysis frequency is no more than 100 MHz, the element model description format is a behavior model, the via model is modeled with only a capacitance value, and the layout model is modeled in consideration of dielectric absorption. According to the partial model reliability value database in FIG. 2, in this case the partial model reliability value of the element model is 90, the partial model reliability value of the via model is 80, and the partial model reliability value of the layout model is 100. According to the partial model influence value database in FIG. 3, the partial model influence value of the element model is 100, the partial model influence value of the via model is 20, and the partial model influence value of the layout model is 60. Hence the analysis result reliability value is $((90\times100)+(80\times20)+(100\times60))/(100+20+60)=92.2$.

Next, the reliability value evaluation unit 23 determines whether or not the analysis result reliability value exceeds a predetermined lower limit (S15). If so (S15, Y), the flow ends. If not (S15, N), a margin value to be added to the analysis result during the good/bad determination is calculated and output to the analysis result determination unit (S16), whereupon the flow ends.

By adding the margin value to the threshold used in the good/bad determination performed by the analysis result determination unit, the reliability value of the good/bad determination can be improved when the analysis result reliability value is low. An example of a formula for determining the margin value is power supply voltage×(100-analysis result reliability value)/100×K. As a specific example, when the analysis result reliability value is 70 and a coefficient K is 0.3, the margin value is approximately 0.3V.

Figure 5:
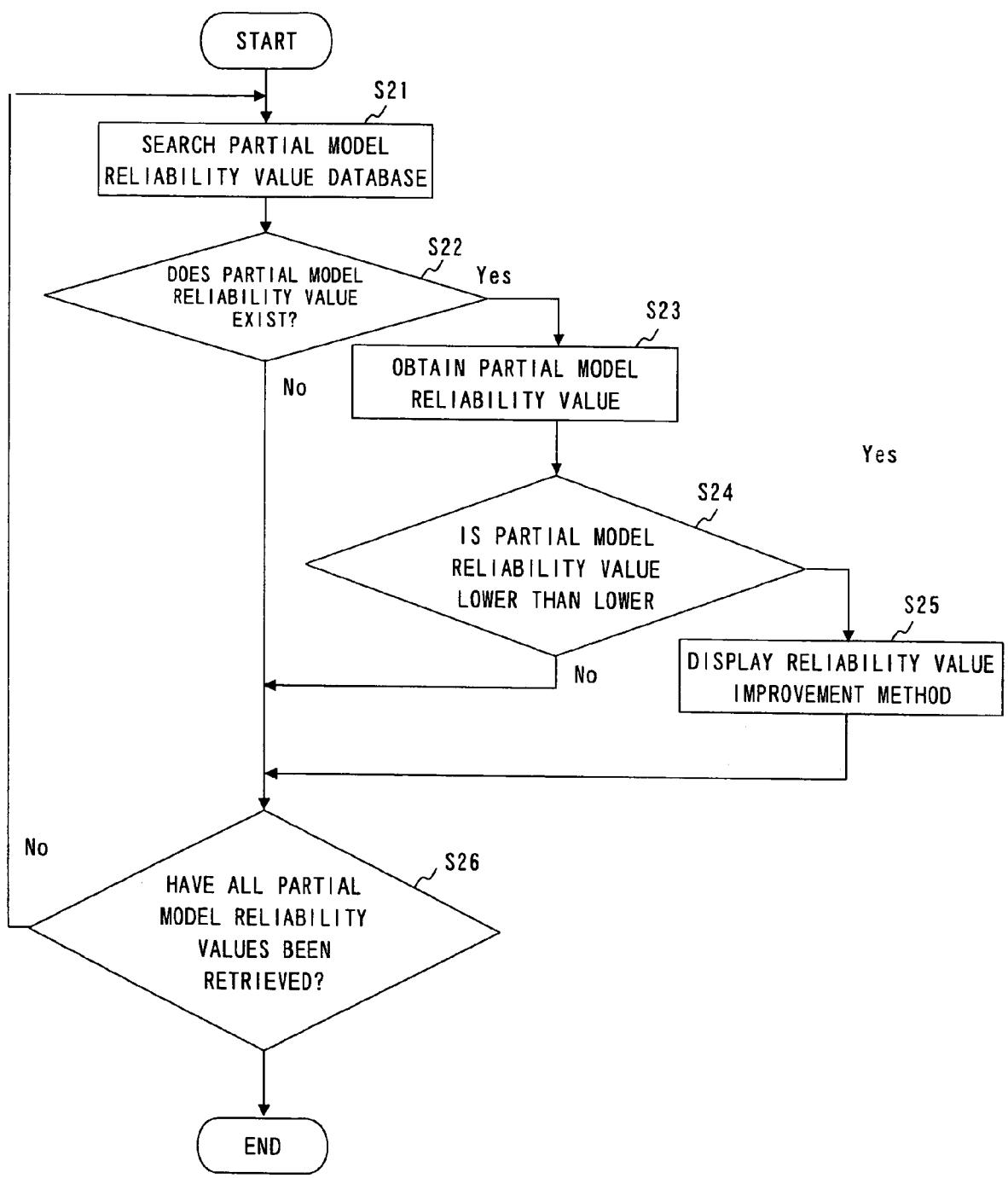
FIG. 5 is a flowchart showing an example of an operation performed in the reliability value evaluation unit to evaluate the reliability value of a partial model.

Next, the operation performed in the reliability value evaluation unit 23 to evaluate the partial model reliability value will be described in detail. FIG. 5 is a flowchart showing an example of the operation performed in the reliability value evaluation unit to evaluate the reliability value of a partial model. First, the reliability value evaluation unit 23 retrieves a subject partial model from the partial model reliability value database 21 (S21). Next, the reliability value evaluation unit 23 determines whether or not the partial model reliability value of the subject partial model exists in the partial model reliability value database 21 (S22).

If no partial model reliability value corresponding to the input information exists (S22, N), the flow moves to a process S26. If a partial model reliability value corresponding to the input information exists (S22, Y), the partial model reliability value is obtained from the partial model reliability value database (S23), and a determination is made as to whether or not the partial model reliability value exceeds a predetermined lower limit (S24). When the partial model reliability value does not fall below the lower limit (S24, N), the flow moves to the process S26. If the partial model reliability value does fall below the lower limit (S24, Y), a reliability value improvement method is displayed (S25), whereupon the flow moves to the process S26. Display of the reliability value improvement method will be described in detail hereafter.

Next, the reliability value evaluation unit 23 determines whether or not all of the partial model reliability values have been retrieved (S26). If all of the partial model reliability values have not been retrieved (S26, N), the flow returns to the process S21. When all of the partial model reliability values have been retrieved (S26, Y), the flow ends.

Figure 6:
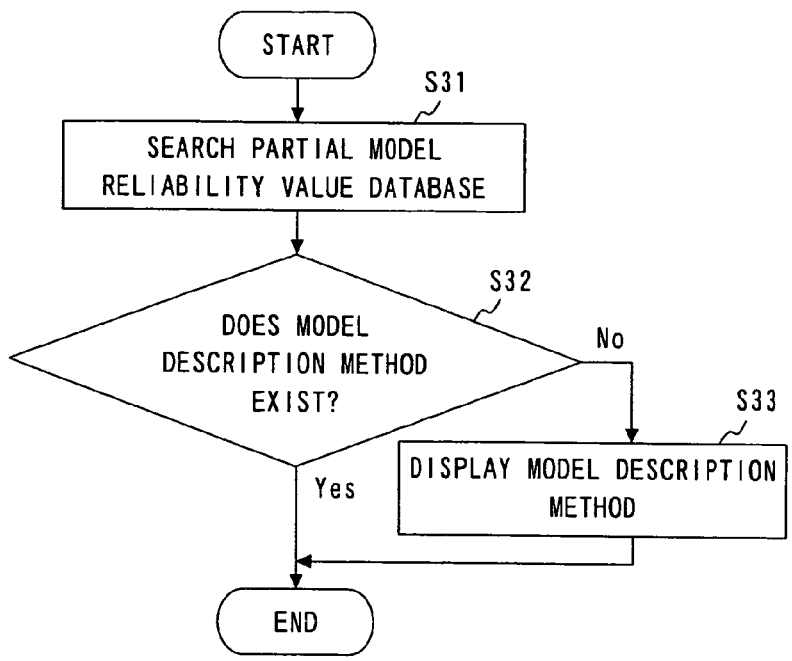
FIG. 6 is a flowchart showing an example of an operation performed in the reliability value evaluation unit to display a reliability value improvement method.

Next, the operation performed in the reliability value evaluation unit 23 to display a reliability value improvement method will be described in detail. FIG. 6 is a flowchart showing an example of the operation performed in the reliability value evaluation unit to display a reliability value improvement method. First, the reliability value evaluation unit 23 retrieves a subject partial model from the partial model reliability value database 21 (S31). Next, the reliability value evaluation unit 23 determines whether a model description method having a partial model reliability value that is higher than the lower limit exists for the subject partial model (S32). If a model description method having a partial model reliability value that is higher than the lower limit does not exist (S32, N), the flow ends. If a model description method having a partial model reliability value that is higher than the lower limit does exist (S32, Y), this model description method is output to the display unit (S33).

Figure 7:
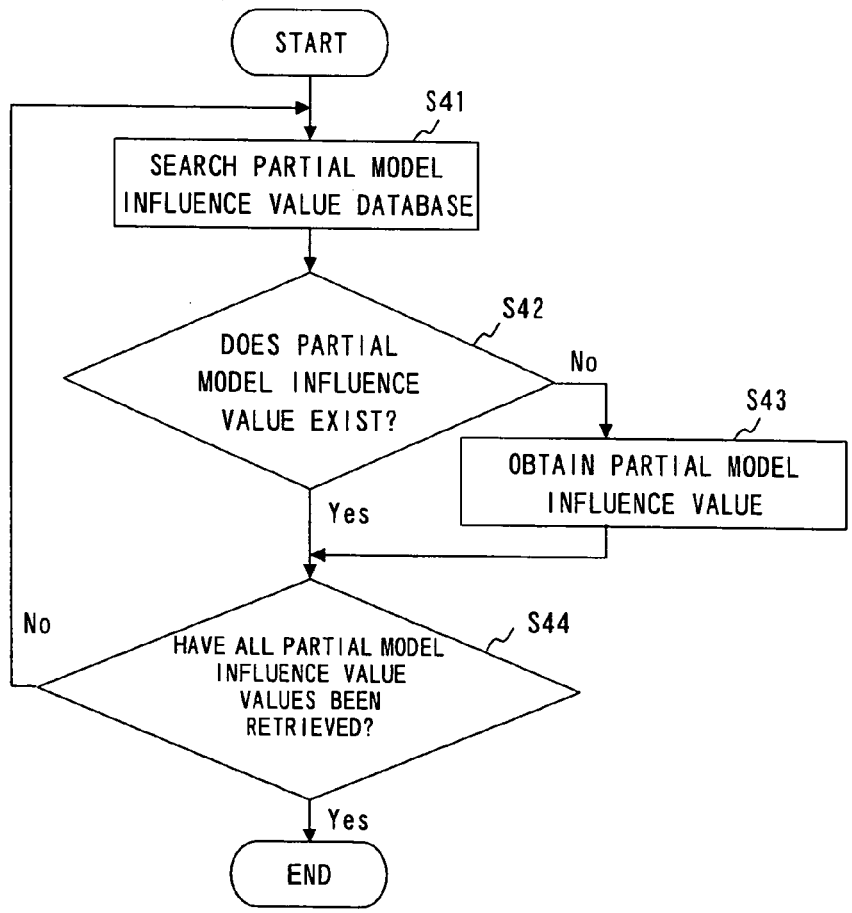
FIG. 7 is a flowchart showing an example of an operation performed in the reliability value evaluation unit to evaluate the influence value of a partial model.

Next, the operation performed in the reliability value evaluation unit 23 to evaluate the partial model influence value will be described in detail. FIG. 7 is a flowchart showing an example of the operation performed in the reliability value evaluation unit to evaluate the influence value of a partial model. First, the reliability value evaluation unit 23 retrieves a subject partial model from the partial model influence value database 22 (S41). Next, the reliability value evaluation unit 23 determines whether or not the partial model influence value of the subject partial model exists in the partial model influence value database 22 (S42).

If no partial model influence value exists (S42, N), the flow moves to a process S43. If a partial model influence value exists (S42, Y), the partial model influence value is obtained from the partial model influence value database 22 (S43). Next, the reliability value evaluation unit determines whether or not all of the partial model influence values have been retrieved (S44). If all of the partial model influence values have not been retrieved (S44, N), the flow returns to the process S41. When all of the partial model influence values have been retrieved (S44, Y), the flow ends.

Figure 8:
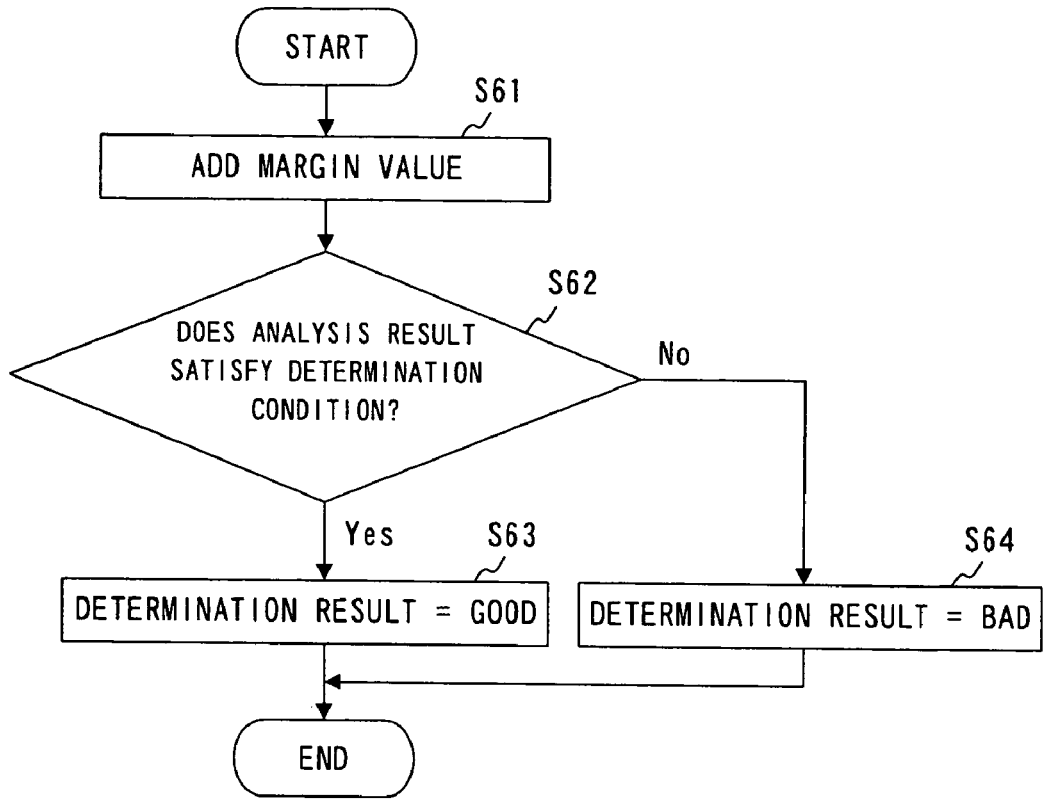
FIG. 8 is a flowchart showing an example of an operation of an analysis result determination unit according to this embodiment.

Next, an operation of the analysis result determination unit 14 will be described. FIG. 8 is a flowchart showing an example of an operation of the analysis result determination unit according to this embodiment. First, the analysis result determination unit 14 adds the margin value to the analysis result waveform obtained from the analysis unit 3 (S61). Next, the analysis result determination unit 14 determines whether or not the analysis result waveform satisfies the determination condition (S62). If the determination condition is satisfied (S62, Y), the determination result is deemed good (S63), and the flow ends. If the determination condition is not satisfied (S62, N), the determination result is deemed bad (S64), and the flow ends.

Analysis is typically more time-consuming than analytic model creation. Therefore, by evaluating the reliability value of the analysis result in advance and creating an analytic model with a high degree of analysis result reliability value, time required to re-execute analysis and so on can be saved, and hence the development period of an electronic circuit can be shortened.

What is claimed is:

1. An electronic circuit analyzing apparatus for performing analysis of an electronic circuit on the basis of input information describing said electronic circuit, comprising:
    an analytic model creation unit that creates an analytic model of said electronic circuit on the basis of said input information with a plurality of partial models of said analytic model;
    wherein a partial model is created on the basis of the input information and a plurality of modeling methods predetermined for each part of said analytic model;
    a reliability value evaluation unit that calculates an analysis result reliability value for each of the plurality of modeling methods used for each part of said analytic model assuming same analysis result influence value that defines a magnitude of influence value on said analysis result for each of the plurality of modeling methods used for each part of said analytic model;
    wherein the reliability value evaluation unit calculates a partial model reliability value on the basis of the analysis result reliability value defined for each of the plurality of modeling methods used for that partial model; and
    wherein said reliability value evaluation unit calculates an analysis result reliability value of said electronic circuit on the basis of the partial model reliability values of the plurality of partial models of said analytic model;
    an analysis unit that calculates an analysis result of each of the plurality of partial models of said analytic model on the basis of the partial model reliability values using the partial model;
    wherein the analysis unit calculates an analysis result of said electronic circuit using the analysis result reliability value of said electronic circuit using said analytical model; and
    a display unit that displays at least one of the analysis result, the analysis result reliability value or a combination thereof for each of the plurality of partial models and for said electronic circuit.

2. The electronic circuit analyzing apparatus as set forth in claim 1, wherein said partial model reliability value is further defined for each frequency of a frequency range.

3. The electronic circuit analyzing apparatus as set forth in claim 1, wherein said reliability value evaluation unit calculates the partial model reliability value for the analysis result of the partial model by averaging the analysis result reliability value for each of the plurality of modeling methods used in that partial model.

4. The electronic circuit analyzing apparatus as set forth in claim 1, wherein said reliability value evaluation unit calculates the analysis result reliability value of said electronic circuit by averaging the partial model reliability value for each part of said analytic model.

5. An electronic circuit analyzing apparatus for performing analysis of an electronic circuit on the basis of input information describing said electronic circuit, comprising:
    an analytic model creation unit that creates an analytic model of said electronic circuit on the basis of said input information with a plurality of partial models of said analytic model;
    wherein a partial model is created on the basis of the input information and a plurality of modeling methods predetermined for each part of said analytic model;
    a reliability value evaluation unit that calculates an analysis result reliability value that defines an accuracy of said analysis result for each of the plurality of modeling methods used for each part of said analytic model and an analysis result influence value that defines a magnitude of influence value on said analysis result for each of the plurality of modeling methods used for each part of said analytic model;
    wherein the reliability value evaluation unit calculates a partial model reliability value on the basis of the analysis result reliability value defined for each of the plurality of modeling methods used for that partial model; and
    wherein said reliability value evaluation unit calculates an analysis result reliability value of said electronic circuit on the basis of the partial model reliability values of the plurality of partial models of said analytic model;
    an analysis unit that calculates an analysis result of each of the plurality of partial models of said analytic model on the basis of the partial model reliability values using the partial model;
    wherein the analysis unit calculates an analysis result of said electronic circuit using the analysis result reliability value of said electronic circuit using said analytical model; and
    a display unit that displays at least one of the analysis result, the analysis result reliability value or a combination thereof for each of the plurality of partial models and for said electronic circuit.

6. The electronic circuit analyzing apparatus as set forth in claim 5, wherein said partial model reliability value is further defined for each frequency of a frequency range, and said partial model influence value is further defined for each frequency of a frequency range.

7. The electronic circuit analyzing apparatus as set forth in claim 5, wherein said reliability value evaluation unit calculates the partial model reliability value for the analysis result of the partial model by multiplying the analysis result reliability value and the analysis result influence value for each of the plurality of modeling methods used in that partial model, adding together the results of this multiplication for all of the plurality of modeling methods, and dividing the result of this addition by a sum of the influence values of the plurality of modeling methods used in that partial model.

8. The electronic circuit analyzing apparatus as set forth in claim 5, wherein said reliability value evaluation unit calculates the analysis result reliability value of said electronic circuit by multiplying the partial model reliability value and partial model influence value for each part of said analytic model, adding together the results of this multiplication for all parts of said analytic model, and dividing the result of this addition by a sum of the partial model influence values.

9. The electronic circuit analyzing apparatus as set forth in claim 1, wherein said reliability value evaluation unit further outputs a low reliability value part, which is a part in which said partial model reliability value falls below a predetermined lower limit.

10. The electronic circuit analyzing apparatus as set forth in claim 1, comprising an analysis result determination unit that determines whether said analysis result is good or bad.

11. An electronic circuit analyzing method for performing analysis of an electronic circuit on the basis of input information describing said electronic circuit, comprising:
creating an analytic model of said electronic circuit on the basis of said input information with a plurality of partial models of said analytic model;
wherein a partial model is created on the basis of the input information and a plurality of modeling methods pre-determined for each part of said analytic model;
calculating an analysis result reliability value for each of the plurality of modeling methods used for each part of said analytic model assuming same analysis result influence value that defines a magnitude of influence value on said analysis result for each of the plurality of modeling methods used for each part of said analytic model;
calculating a partial model reliability value on the basis of the analysis result reliability value defined for each of the plurality of modeling methods used for that partial model;
calculating an analysis result reliability value of said electronic circuit on the basis of the partial model reliability values of the plurality of partial models of said analytic model;
calculating an analysis result of each of the plurality of partial models of said analytic model on the basis of the partial model reliability values using the partial model;
calculating an analysis result of said electronic circuit using the analysis result reliability value of said electronic circuit using said analytical model; and
displaying at least one of the analysis result, the analysis result reliability value or a combination thereof for each of the plurality of partial models and for said electronic circuit.

12. The electronic circuit analyzing method as set forth in claim 11, wherein said partial model reliability value is further defined for each frequency of a frequency range.

13. The electronic circuit analyzing method as set forth in claim 11, wherein said reliability value evaluation unit calculates the partial model reliability value for the analysis result of the partial model by averaging the analysis result reliability value for each of the plurality of modeling methods used in that partial model.

14. The electronic circuit analyzing method as set forth in claim 11, wherein said reliability value evaluation unit calculates the analysis result reliability value of said electronic circuit by averaging the partial model reliability value for each part of said analytic model.

15. An electronic circuit analyzing method for performing analysis of an electronic circuit on the basis of input information describing said electronic circuit, comprising:
creating an analytic model of said electronic circuit on the basis of said input information with a plurality of partial models of said analytic model;
wherein a partial model is created on the basis of the input information and a plurality of modeling methods pre-determined for each part of said analytic model;
calculating an analysis result reliability value that defines an accuracy of said analysis result for each of the plurality of modeling methods used for each part of said analytic model and an analysis result influence value that defines a magnitude of influence value on said analysis result for each of the plurality of modeling methods used for each part of said analytic model;
calculating a partial model reliability value on the basis of the analysis result reliability value defined for each of the plurality of modeling methods used for that partial model;
calculating an analysis result reliability value of said electronic circuit on the basis of the partial model reliability values of the plurality of partial models of said analytic model;
calculating an analysis result of each of the plurality of partial models of said analytic model on the basis of the partial model reliability values using the partial model;
calculating an analysis result of said electronic circuit using the analysis result reliability value of said electronic circuit using said analytical model; and
displaying at least one of the analysis result, the analysis result reliability value or a combination thereof for each of the plurality of partial models and for said electronic circuit.

16. The electronic circuit analyzing method as set forth in claim 15, wherein the partial model reliability value for the analysis result of the partial model is calculated by multiplying the analysis result reliability value and the analysis result influence value for each of the plurality of modeling methods used in that partial model, adding together the results of this multiplication for all of the plurality of modeling methods, and dividing the result of this addition by a sum of the influence values of the plurality of modeling methods used in that partial model.

17. The electronic circuit analyzing method as set forth in claim 15, wherein said partial model reliability value is further defined for each frequency of a frequency range, and said partial model influence value is further defined for each frequency of a frequency range.

18. The electronic circuit analyzing method as set forth in claim 15, wherein the analysis result reliability value of said electronic circuit is calculated by multiplying the partial model reliability value and partial model influence value for each part of said analytic model, adding together the results of this multiplication for all parts of said analytic model, and dividing the result of this addition by a sum total of the partial model influence values.

19. An electronic medium having recorded thereon an electronic circuit analyzing program for causing a computer to perform operations to execute analysis of an electronic circuit on the basis of input information describing said electronic circuit, said program comprising instructions for:
creating an analytic model of said electronic circuit on the basis of said input information with a plurality of partial models of said analytic model;
wherein a partial model is created on the basis of the input information and a plurality of modeling methods pre-determined for each part of said analytic model;
calculating an analysis result reliability value for each of the plurality of modeling methods used for each part of said analytic model assuming same analysis result influence value that defines a magnitude of influence value on said analysis result for each of the plurality of modeling methods used for each part of said analytic model;
calculating a partial model reliability value on the basis of the analysis result reliability value defined for each of the plurality of modeling methods used for that partial model;
calculating an analysis result reliability value of said electronic circuit on the basis of the partial model reliability values of the plurality of partial models of said analytic model;

calculating an analysis result of each of the plurality of partial models of said analytic model on the basis of the partial model reliability values using the partial model;

calculating an analysis result of said electronic circuit using the analysis result reliability value of said electronic circuit using said analytical model; and displaying at least one of the analysis result, the analysis result reliability value or a combination thereof for each of the plurality of partial models and for said electronic circuit.

20. The electronic medium of claim 19, wherein said partial model reliability value is further defined for each frequency of a frequency range.

21. The electronic medium claim 19, wherein said program further comprising instructions for:

calculating the partial model reliability value for the analysis result of the partial model by averaging the analysis result reliability value for each of the plurality of modeling methods used in that partial model.

22. The electronic medium claim 19, wherein said program further comprising instructions for:

calculating the analysis result reliability value of said electronic circuit by averaging the partial model reliability value for each part of said analytic model.

23. An electronic medium having recorded thereon an electronic circuit analyzing program for causing a computer perform operations to execute analysis of an electronic circuit on the basis of input information describing said electronic circuit, said program comprising instructions for:

creating an analytic model of said electronic circuit on the basis of said input information with a plurality of partial models of said analytic model;

wherein a partial model is created on the basis of the input information and a plurality of modeling methods predetermined for each part of said analytic model;

calculating an analysis result reliability value that defines an accuracy of said analysis result for each of the plurality of modeling methods used for each part of said analytic model and an analysis result influence value that defines a magnitude of influence value on said analysis result for each of the plurality of modeling methods used for each part of said analytic model;

calculating a partial model reliability value on the basis of the analysis result reliability value defined for each of the plurality of modeling methods used for that partial model;

calculating an analysis result reliability value of said electronic circuit on the basis of the partial model reliability values of the plurality of partial models of said analytic model;

calculating an analysis result of each of the plurality of partial models of said analytic model on the basis of the partial model reliability values using the partial model;

calculating an analysis result of said electronic circuit using the analysis result reliability value of said electronic circuit using said analytical model; and displaying at least one of the analysis result, the analysis result reliability value or a combination thereof for each of the plurality of partial models and for said electronic circuit.

24. The electronic medium of claim 23, wherein said partial model reliability value is further defined for each frequency of a frequency range, and said partial model influence value is further defined for each frequency of a frequency range.

25. The electronic medium claim 23, wherein said program further comprising instructions for:

calculating the partial model reliability value for the analysis result of the partial model by multiplying the analysis result reliability value and the analysis result influence value for each of the plurality of modeling methods used in that partial model, adding together the results of this multiplication for all of the plurality of modeling methods, and dividing the result of this addition by a sum of the influence values of the plurality of modeling methods used in that partial model.

26. The medium of claim 23, wherein said program further comprising instructions for:

calculating the analysis result reliability value of said electronic circuit by multiplying the partial model reliability value and partial model influence value for each part of said analytic model, adding together the results of this multiplication for all parts of said analytic model, and dividing the result of this addition by a sum of the partial model influence values.

* * * * *

UNITED STATES PATENT AND TRADEMARK OFFICE
CERTIFICATE OF CORRECTION

| | |
|---|---|
| PATENT NO. | : 7,366,648 B2 |
| APPLICATION NO. | : 10/992731 |
| DATED | : April 29, 2008 |
| INVENTOR(S) | : Shogo Fujimori |

It is certified that error appears in the above-identified patent and that said Letters Patent is hereby corrected as shown below:

Column 13, Line 14, after "medium" insert --of--.

Column 13, Line 20, after "medium" insert --of--.

Column 14, Line 22, after "medium" insert --of--.

Signed and Sealed this

Sixteenth Day of September, 2008

JON W. DUDAS
*Director of the United States Patent and Trademark Office*